United States Patent
Saito

(10) Patent No.: US 6,323,945 B1
(45) Date of Patent: Nov. 27, 2001

(54) COMA ABERRATION AUTOMATIC MEASURING MARK AND MEASURING METHOD

(75) Inventor: Hirofumi Saito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/464,211

(22) Filed: Dec. 15, 1999

(30) Foreign Application Priority Data

Dec. 15, 1998 (JP) ................................... 10-356299

(51) Int. Cl.⁷ .............................. G01B 9/00; G03B 27/42
(52) U.S. Cl. ............................................... 356/124; 355/53
(58) Field of Search .................................... 356/124, 127, 356/399, 400, 401; 355/53, 55, 77; 250/548; 430/5, 30

(56) References Cited

U.S. PATENT DOCUMENTS

| | | | | |
|---|---|---|---|---|
| 4,814,829 | * | 3/1989 | Kosugi et al. | 355/43 |
| 4,908,656 | * | 3/1990 | Suwa et al. | 355/53 |
| 5,300,786 | * | 4/1994 | Brunner et al. | 250/548 |
| 5,402,224 | * | 3/1995 | Hirukawa et al. | 356/124 |
| 5,615,006 | * | 3/1997 | Hirukawa et al. | 356/124 |
| 6,088,113 | * | 7/2000 | Kim | 356/401 |

FOREIGN PATENT DOCUMENTS

| | | |
|---|---|---|
| 10-232185 | 9/1998 | (JP) . |
| 10-260108 | 9/1998 | (JP) . |
| 11-297614 | * 10/1999 | (JP) . |

* cited by examiner

Primary Examiner—Hoa Q. Pham

(57) ABSTRACT

Two coma aberration automatic measuring marks M1 and M2 of a first-order diffraction grating are each composed of a plurality of elongated isosceles triangle patterns which are so arranged that the axis of symmetry passing on the center of each elongated isosceles triangle is parallel to one another, that a half P1, P2, and P3 of the elongated isosceles triangle patterns have the widths thereof which extend in a direction opposite to that of the remaining half P4, P5 and P6 of the elongated isosceles triangle patterns, and the elongated isosceles triangle patterns are located separately from one another, in a direction perpendicular to the axis of symmetry passing on the center of each elongated isosceles triangle, and at a pitch diffracting a measuring coherent light. The two first-order diffraction gratings M1 and M2 are located separately from each other in a direction of the axis of symmetry passing on the center of the elongated isosceles triangle, in such a manner that the elongated isosceles triangle patterns included in the two first-order diffraction gratings are in symmetry to each other, in connection with a line positioned between the two first-order diffraction gratings and which is perpendicular to the axis of symmetry passing on the center of the elongated isosceles triangle. The two first-order diffraction gratings are scanned by the measuring coherent light, and a relative distance R1 between diffraction lights generated by the two first-order diffraction gratings, is measured and compared with a distance R between the two first-order diffraction gratings.

12 Claims, 4 Drawing Sheets

PRIOR ART                    NO ABERRATION

PRIOR ART                    COMA ABERRATION

PRIOR ART                SPHERICAL ABERRATION

COMA ABERRATION AUTOMATIC MEASURING MARK AND MEASURING METHOD

BACKGROUND OF THE INVENTION

The present invention relates to a coma aberration automatic measuring mark used for measuring only a coma aberration of various aberrations of a lens system used in a reduction projection exposure, and a method for measuring the coma aberration by using the coma aberration automatic measuring mark.

One important factor is to quickly and simply measure a coma aberration of a reduction projection lens system. Now, a prior art method for measuring the coma aberration of the reduction projection lens system will be described with reference to FIGS. 1A and 1B.

As shown in FIG. 1A, a prior art coma aberration automatic measuring mark is constituted of a plurality of strip-shaped patterns L1 L2, L3, L4 and L5 arranged in parallel to one another and separately from one another, at a pitch which is about a double of a wavelength of an exposure light. A line width of a projected pattern of each of the strip-shaped patterns L1, L2, L3. L4 and L5 is measured by for example a length measuring SEM (scanning electron microscope), and the amount of coma aberration is calculated from a difference in the line width between the strip-shaped patterns L1 and L5 positioned at opposite side ends of the projected coma aberration automatic measuring mark, as shown in FIGS. 1A and 1B.

FIG. 1A illustrates a case having no coma aberration, and FIG. 1B illustrates a case having a coma aberration. FIG. 1C illustrates a case having a spherical aberration.

In the prior art, however, when the coma aberration is very large, it is not possible to carry out an automatic measurement utilizing an image processing, and therefore, the coma aberration must be measured manually, with the result that the measurement needs a considerable time. Therefore, adjustment of the reduction projection lens system cannot be smoothly performed, and a satisfactory degree of reproduction cannot be obtained because of the manual measurement. In addition, it is difficult to separate the coma aberration from the other aberrations occurring in the reduction projection lens system.

BRIEF SUMMARY OF THE INVENTION

Accordingly, it is an object of the present invention to provide a coma aberration automatic measuring mark used for automatically measuring the coma aberration with a high degree of reproduction, and a method for measuring the coma aberration by using the coma aberration automatic measuring mark.

The above and other objects of the present invention are achieved in accordance with the present invention by a coma aberration automatic measuring mark comprising a first-order diffraction grating composed of a plurality of elongated isosceles triangle patterns which are so arranged that the axis of symmetry passing on the center of each elongated isosceles triangle is parallel to one another, that a half of the elongated isosceles triangle patterns are located in a direction opposite to that of the remaining half of the elongated isosceles triangle patterns, and the elongated isosceles triangle patterns are located separately from one another, in a direction perpendicular to the axis of symmetry passing on the center of each elongated isosceles triangle, and at a pitch diffracting a measuring coherent light.

Specifically, the pitch diffracting the measuring coherent light is about a double of a lens design wavelength.

In an embodiment of the coma aberration automatic measuring mark, the elongated isosceles triangle patterns includes a first group of elongated isosceles triangle patterns and a second group of elongated isosceles triangle patterns, which are located in symmetry to each other, in connection with a line which is positioned between the first group of elongated isosceles triangle patterns and the second group of elongated isosceles triangle patterns and which is perpendicular to the axis of symmetry passing on the center of the elongated isosceles triangle.

This coma aberration automatic measuring mark is adapted for not only a measurement of a coma aberration but also a measurement of a telecentric property of an optical axis.

According to a second aspect of the present invention, there is provided a method for measuring a coma aberration by using a coma aberration automatic measuring mark, wherein the coma aberration automatic measuring mark comprising at least two first-order diffraction gratings each of composed of a plurality of elongated isosceles triangle patterns which are so arranged that the axis of symmetry passing on the center of each elongated isosceles triangle is parallel to one another, that a half of the elongated isosceles triangle patterns are located in a direction opposite to that of the remaining half of the elongated isosceles triangle patterns, and the elongated isosceles triangle patterns are located separately from one another, in a direction perpendicular to the axis of symmetry passing on the center of each elongated isosceles triangle, and at a pitch diffracting a measuring coherent light, the at least two first-order diffraction gratings being located separately from each other in a direction of the axis of symmetry passing on the center of the elongated isosceles triangle, in such a manner that the elongated isosceles triangle patterns included in the at least two first-order diffraction gratings are in symmetry to each other, in connection with a line which is positioned between the at least two first-order diffraction gratings and which is perpendicular to the axis of symmetry passing on the center of the elongated isosceles triangle, and wherein the method includes the steps of scanning the at least two first-order diffraction gratings by the measuring coherent light, measuring a relative distance between diffraction lights generated by the at least two first-order diffraction gratings, and comparing the measured relative distance with a distance between the at least two first-order diffraction gratings.

Specifically, a distance between the at least two first-order diffraction gratings located in symmetry to each other is set to a distance which is sufficiently longer than a wavelength of a measuring coherent light and which is on the order which can make negligible an Abbe error occurring in a coordinate measuring system and a distortion occurring in a reduction projection lens.

This method can be used for measuring a telecentric property of an optical axis, in place of measuring the coma aberration.

Here, the triangular patterns constituting the coma aberration automatic measuring mark are not limited to the elongated isosceles triangle patterns, but are sufficient if the triangular patterns are elongated triangular patterns which can be so located that a half of the elongated triangular patterns are located in a direction opposite to that of the remaining half of the elongated triangular patterns, and the elongated triangular patterns are located in parallel to each other and separately from one another, at a pitch diffracting a measuring coherent light, in a direction substantially perpendicular to the long axis that extends from the vertex between two long sides of three sides of the elongated triangle to the shortest side of the three sides of the elongated triangle, perpendicularly to the shortest side of the elongated triangle.

The above and other objects, features and advantages of the present invention will be apparent from the following description of preferred embodiments of the invention with reference to the accompanying drawings.

DETAILED DESCRIPTION OF THE INVENTION

Now, embodiments of the present invention will be described with reference to the drawings.

Figure 2:
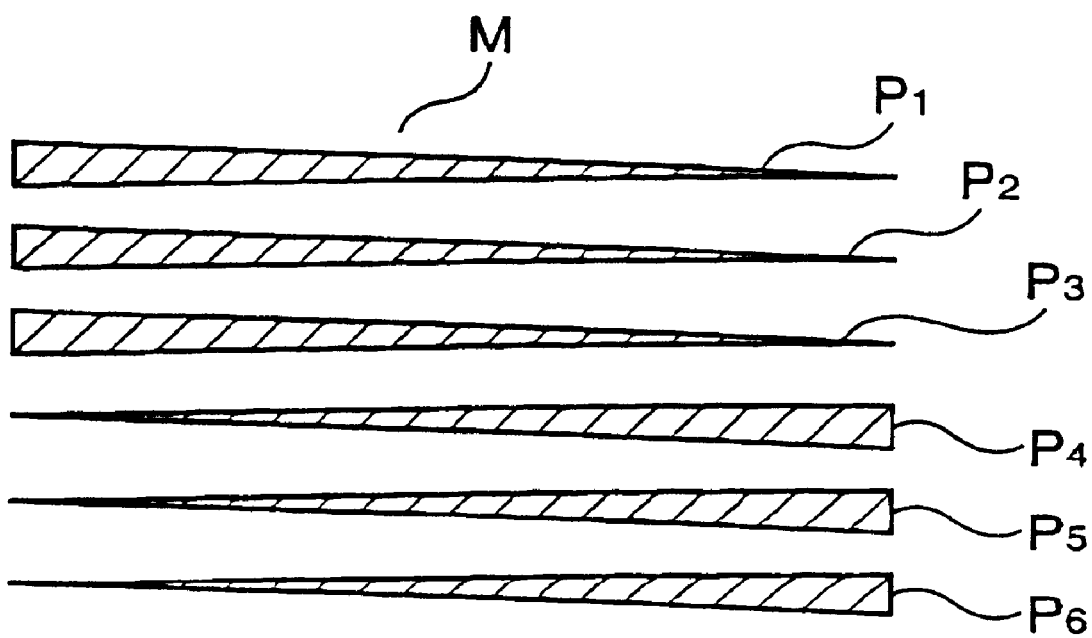
FIG. 2 is a diagrammatic view of an embodiment of the coma aberration automatic measuring mark in accordance with the present invention.
Figure 3:
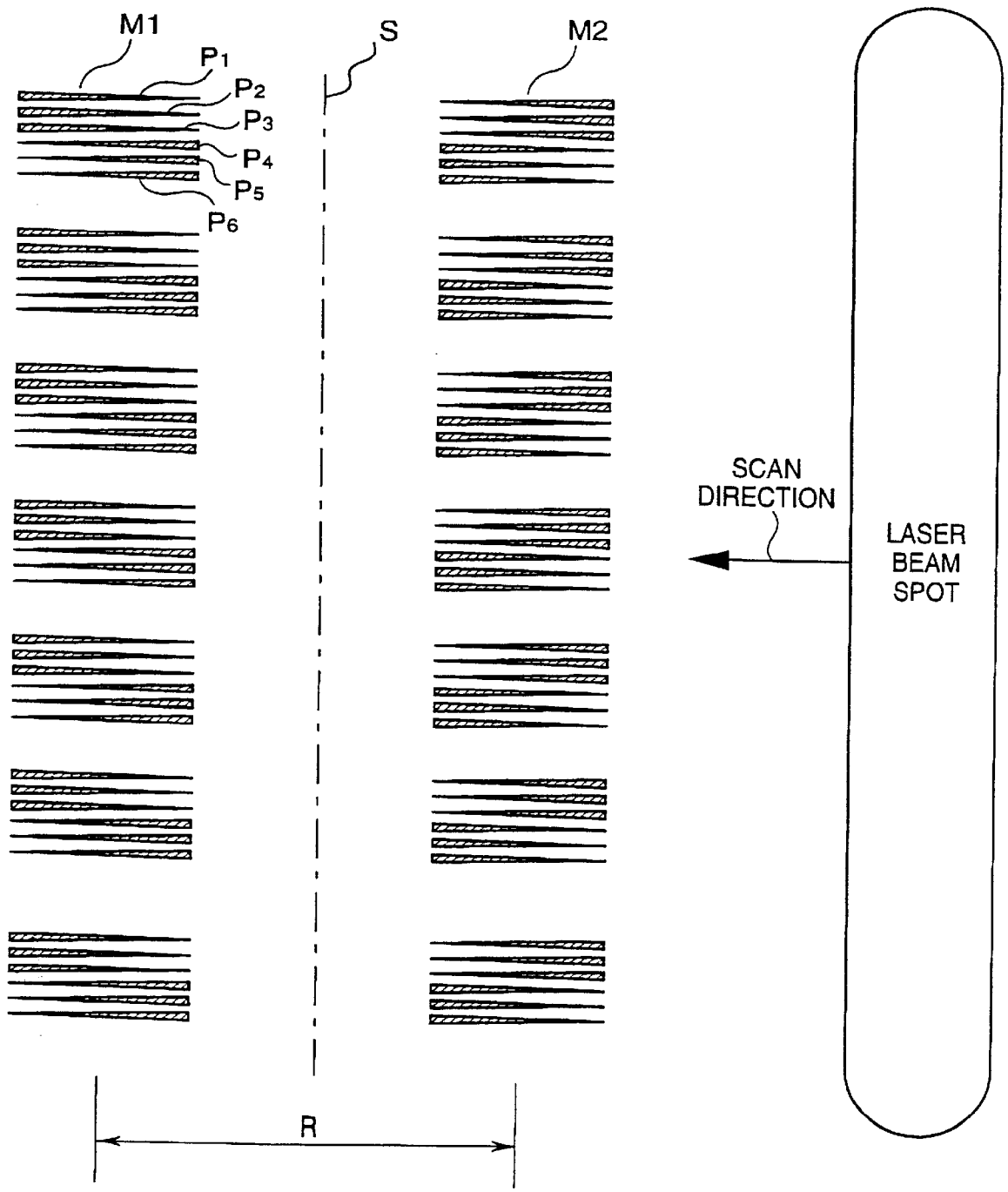
FIG. 3 is a diagrammatic view illustrating a method in accordance with the present invention for measuring the coma aberration by using the embodiment of the coma aberration automatic measuring mark in accordance with the present invention.

FIG. 2 is a diagrammatic view of an embodiment of the coma aberration automatic measuring mark in accordance with the present invention. FIG. 3 is a diagrammatic view illustrating a method in accordance with the present invention for measuring the coma aberration by using the embodiment of the coma aberration automatic measuring mark in accordance with the present invention.

The present invention is characterized by making it possible to quantitatively measure only a coma aberration of various aberrations of a lens system used in a reduction projection exposure.

As shown in FIG. 2, the embodiment of the coma aberration automatic measuring mark in accordance with the present invention is generally designated by the reference sign M, and includes a first-order diffraction grating composed of a plurality of elongated isosceles triangle patterns P1, P2, P3, P4, P5 and P6 which are arranged at a pitch which is about a double of a lens design wavelength. Specifically, the plurality of elongated isosceles triangle patterns P1, P2, P3, P4, P5 and P6 are so arranged that the axis of symmetry passing on the center of each elongated isosceles triangle is parallel to one another, that a half P1, P2 and P3 of the elongated isosceles triangle patterns are located in a direction opposite to that of the remaining half P4, P5 and P6 of the elongated isosceles triangle patterns, and the elongated isosceles triangle patterns are located separately from one another, in a direction perpendicular to the axis of symmetry passing on the center of each elongated isosceles triangle, and at a pitch diffracting a measuring coherent light. Here, the elongated isosceles triangle patterns P1, P2, P3, P4, P5 and P6 has the length which is about five times to ten times the width. However, the length is not limited to this range.

Figure 1A:
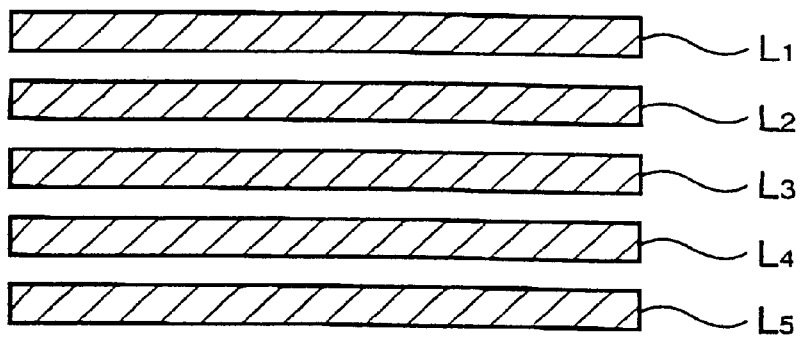
FIGS. 1A, 1B and 1C are diagrammatic views of a prior art aberration automatic measuring mark and projected images thereof, for illustrating a prior art method for measuring the aberrations of the reduction projection lens system.
Figure 1B:
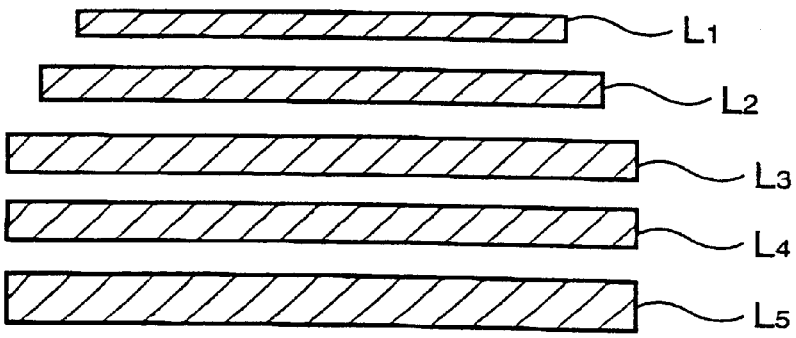
Figure 1C:
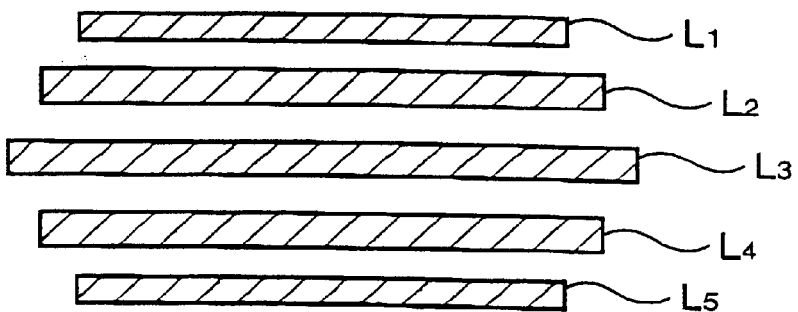

As mentioned above, the patterns P1, P2, P3, P4, P5 and P6 which constitute the coma aberration automatic measuring mark M in accordance with the present invention are formed in the form of an elongated triangle, in place of a line and space pattern shown in FIG. 1. This is because the triangular pattern is more susceptible to influence of the coma aberration, than the strip or elongated rectangular pattern in the line and space pattern, and therefore, it is possible to sensitively measure the coma aberration.

As shown in FIG. 2, in the embodiment of the coma aberration automatic measuring mark M in accordance with the present invention, the elongated isosceles triangle patterns P1, P2, P3, P4, P5 and P6 are divided into a first group which includes a first half of the elongated isosceles triangle patterns (P1, P2, P3) and a second group which includes the remaining half of the elongated isosceles triangle pattern (P4, P5 and P6), and the direction of the first group of the elongated isosceles triangle patterns P1, P2, P3 is opposite to the direction of the second group of the elongated isosceles triangle pattern P4, P5 and P6. In addition, the elongated isosceles triangle patterns P1, P2, P3, P4, P5 and P6 are located separately from one another in a direction perpendicular to the axis of symmetry passing on the center of each elongated isosceles triangle, and at a "pitch which is about a double of a lens design wavelength", which is sufficient to diffract a measuring coherent light. Incidentally, the number of the elongated isosceles triangle patterns included in the coma aberration automatic measuring mark M in accordance with the present invention, is in no way limited to 6 as shown in FIG. 2, but also can be freely selected if the first-order diffraction grating is constituted.

Now, a method for measuring the coma aberration by using the coma aberration automatic measuring mark M in accordance with the present invention, will be described with reference to FIG. 3. Two coma aberration automatic measuring marks M as shown in FIG. 2, namely, two coma aberration automatic measuring marks M1 and M2 as shown in FIG. 3 are located separately from each other by a distance R in a direction of the axis of symmetry passing on the center of each elongated isosceles triangle pattern, and in symmetry to each other in connection of an axis of symmetry "S" which is positioned between the two coma aberration automatic measuring marks M1 and M2 (and which is perpendicular to the axis of symmetry passing on the center of the elongated isosceles triangle).

In this case, furthermore, the two coma aberration automatic measuring marks M1 and M2 are so located that the direction of the elongated isosceles triangle patterns P1, P2, P3, P4, P5 and P6 included in the coma aberration automatic measuring mark M1 are opposite to the direction of the corresponding elongated isosceles triangle patterns included in the coma aberration automatic measuring mark M2. Therefore, in the two coma aberration automatic measuring marks M1 and M2 in symmetry to each other, the elongated isosceles triangle patterns P1, P2, P3, P4, P5 and P6 included in the coma aberration automatic measuring mark M1 and the elongated isosceles triangle patterns included in the coma aberration automatic measuring mark M2 are in symmetry in connection of the axis of symmetry "S".

In addition, the distance "R" between a center of the coma aberration automatic measuring mark M1 and a center of the coma aberration automatic measuring mark M2 is set to a distance which is sufficiently longer than a wavelength of a measuring coherent light and which is on the order which can make negligible an Abbe error occurring in a coordinate measuring system and a distortion occurring in a reduction projection lens.

Figure 4:
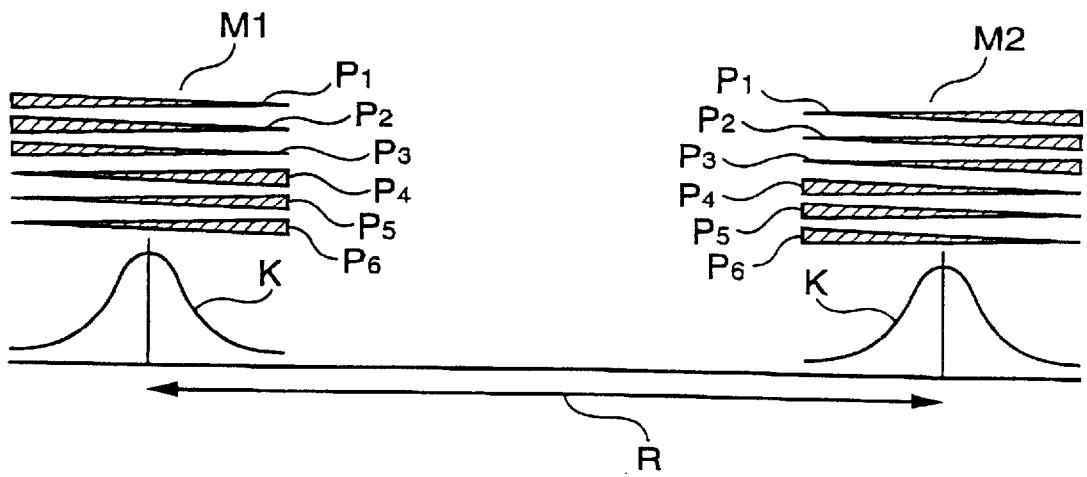
FIG. 4 is a diagrammatic view illustrating the diffraction lights generated by the coma aberration automatic measuring mark in accordance with the present invention, in the case having no coma aberration.
Figure 5:
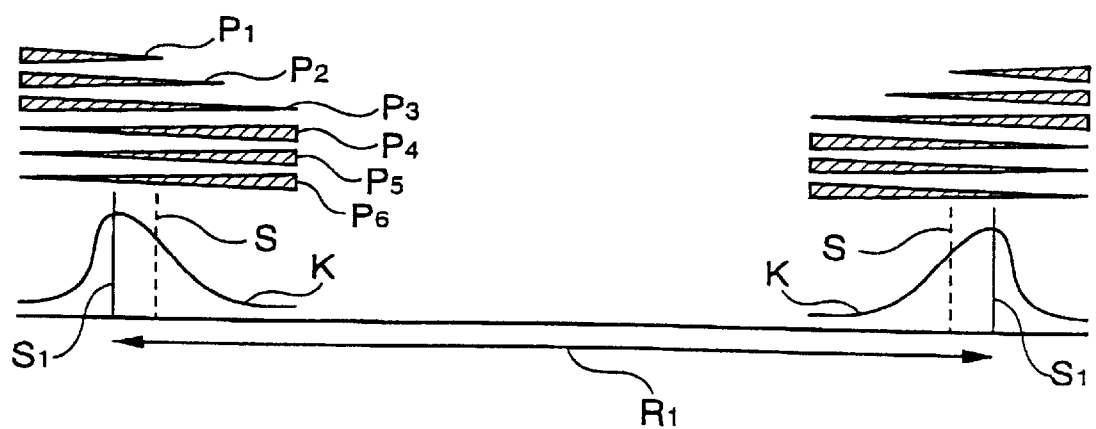
FIG. 5 is a diagrammatic view illustrating the diffraction lights generated by the coma aberration automatic measuring mark in accordance with the present invention, in the case having a coma aberration.

In order to measure the coma aberration by using the coma aberration automatic measuring mark M in accordance with the present invention, the two coma aberration automatic measuring marks (two first-order diffraction gratings) M1 and M2 separated from each other by the distance "R" are scanned by the coherent light (laser beam) as shown in FIG. 3, and as shown in FIGS. 4 and 5, a relative distance "R1" between diffraction lights "K" generated by the two coma aberration automatic measuring marks (two first-order diffraction gratings) M1 and M2, is measured, and then compared with the normal distance "R" between the two first-order diffraction gratings.

In a case having a coma aberration, the relative distance "R1" between the diffraction lights "K" generated by the two first-order diffraction gratings M1 and M2, is converted into the amount of coma aberration. A plurality of pairs of symmetrical coma aberration automatic measuring marks M are previously provided under the same condition as shown in FIG. 3, or alternatively, the same pair of symmetrical coma aberration automatic measuring marks M are measured a plurality of times, so that the results of measurement is averaged to minimize an error to a possible extent.

In other words, according to the present invention, it is possible to quantify the coma aberration by a high speed automatic measurement with the result that the coma aberration in the reduction projection exposure lens can be measured precisely for a short time. In addition, if the coma aberration automatic measuring marks M are located not only in the vertical direction as shown in FIG. 1 but also in a horizontal direction and also in a sagitall direction and in a meridional direction, at a place where the coma aberration of a lens is to be measured, it is possible to clarify the distribution of the coma aberration in the plane of the lens.

If the distribution of the coma aberration thus obtained in the plane of the lens, is fed back to adjustment of the reduction projection lens system, it is possible to correct the coma aberration in an actual pattern, with the result that it is possible to minimize the influence such as the size thinning of the device pattern and the unevenness of the line width, which are caused by the coma aberration.

Next, the specific method for measuring the coma aberration by using the coma aberration automatic measuring mark M in accordance with the present invention, as shown in FIG. 3, will be described with reference to FIG. 5, which is a diagrammatic view illustrating the diffraction lights "K" generated by the coma aberration automatic measuring marks M1 and M2 in accordance with the present invention, in the case having a coma aberration.

The coma aberration is the aberration in which the contrast lowers like a comet, and therefore, the patterns (P1 and P2 in the example shown in FIG. 5) positioned at one end of the coma aberration automatic measuring mark M are thinned. As a result, the projected patterns P1 to P3 and the projected patterns P4 to P6 of the coma aberration automatic measuring a mark M become asymmetrical, as shown in FIG. 5.

Therefore, a peak position S1 of the diffraction lights generated by the coma aberration automatic measuring mark M when it is scanned by the coherent light, is deviated from a normal peak position S. Since the elongated isosceles triangle patterns P1, P2, P3, P4, P5 and P6 included in the coma aberration automatic measuring mark M1 and the elongated isosceles triangle patterns included in the coma aberration automatic measuring mark M2 are in symmetry in connection of the axis of symmetry "S", the distance R1 between the peak position S1 of the diffraction lights generated by the coma aberration automatic measuring mark M1 and the peak position S1 of the diffraction lights generated by the coma aberration automatic measuring mark M2 become longer than the distance R between the normal peak position S of the diffraction lights generated by the coma aberration automatic measuring mark M1 and the normal peak position S of the diffraction lights generated by the coma aberration automatic measuring mark M2 when no coma aberration exists. Therefore, the amount of coma aberration is measured by measuring the distance between the respective peak positions S1 of the diffraction lights "K" generated by the two coma aberration automatic measuring marks M1 and M2.

Figure 6:
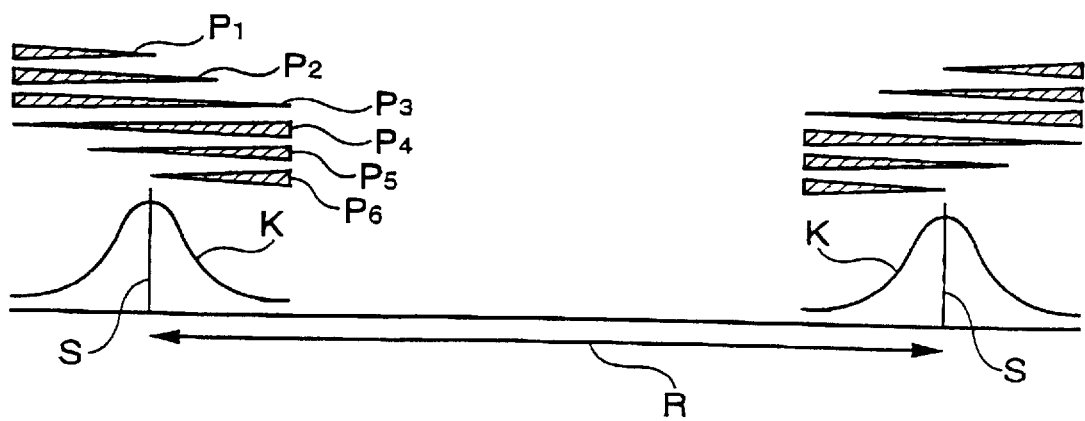
FIG. 6 is a diagrammatic view illustrating the diffraction lights generated by the coma aberration automatic measuring mark in accordance with the present invention, in the case having a spherical aberration.

FIG. 6 is a diagrammatic view illustrating the diffraction lights generated by the coma aberration automatic measuring mark in accordance with the present invention, in the case having a spherical aberration.

The spherical aberration is the aberration in which the contrast lowers simply. Therefore, the patterns (P1 and P2, and P5 and P6 in the example shown in FIG. 6) positioned at both ends of the coma aberration automatic measuring mark M are thinned. As a result, the projected patterns P1 to P3 and the projected patterns P4 to P6 of the coma aberration automatic measuring mark M1 become asymmetrical, as shown in FIG. 6.

As mentioned above, in the case having the spherical aberration, the ends of the patterns are thinned by the spherical aberration. However, if the coma aberration automatic measuring mark in accordance with the present invention is used, the diffraction light generated by the coma aberration automatic measuring mark does not become asymmetrical, and therefore, the peak position of the diffraction lights is not deviated from the normal peak position S, as shown in FIG. 6. The reason for this is that, in the two coma aberration automatic measuring marks M1 and M2 in symmetry to each other, the elongated isosceles triangle patterns P1. P2, P3, P4, P5 and P6 included in one coma aberration automatic measuring mark M1 and the elongated isosceles triangle patterns included in the other coma aberration automatic measuring mark M2 are in symmetry in connection of the axis of symmetry "S" which is perpendicular to the axis of symmetry passing on the center of each elongated isosceles triangle pattern.

Incidentally, the embodiment shown in FIGS. 2 to 6 has been applied to the measurement for the coma aberration, but can be applied for measuring a telecentric property of an optical axis.

Namely, in the case of the coma aberration, the "center of gravity" of the detected signal (corresponding to the peak position S of the diffraction light) does not appreciably change, regardless of whether it is in the best focused condition or in a defocused condition.

However, when the telecentric property of the optical axis is deviated, the peak position of the measured signal changes between the defocused condition of a "+" direction and the defocused condition of a "−" direction.

Therefore, the projected patterns of the coma aberration automatic measuring mark become asymmetrical because of the deviation of the telecentric property of the optical axis. This asymmetry is "0" (zero) in the best focused condition, but becomes large in the defocused condition. Fundamentally, the asymmetry generated in the defocused condition of the "+" direction is reverse to the asymmetry generated in the defocused condition of the "−" direction.

Accordingly, the two first-order diffraction gratings (each of which is the coma aberration automatic measuring mark M shown in FIG. 2) are scanned, and the distance R between the diffraction lights generated by the two first-order diffraction gratings is measured, and a gradient component of the distance between the peak positions caused by the defocusing, is obtained. If it is assumed that the gradient component thus obtained corresponds to the deviation of the telecentric property, the telecentric property can be automatically measured.

Therefore, if the lens is adjusted on the basis of the measurement result, it is possible to minimize the unevenness of the line width which is caused by the coma aberration and the deviation of the telecentric property.

As mentioned above, according to the present invention, since the coma aberration automatic measuring mark is formed of triangular patterns, the coma aberration automatic measuring mark is susceptible to influence of the coma aberration, and therefore, it is possible to sensitively measure the coma aberration.

Therefore, the triangular patterns constituting the coma aberration automatic measuring mark are not limited to the elongated isosceles triangle patterns, but are sufficient if the triangular patterns are elongated triangular patterns which can be so located that a half of the elongated triangular patterns are located in a direction opposite to that of the remaining half of the elongated triangular patterns, and the elongated triangular patterns are located in parallel to each other and separately from one another, at a pitch diffracting a measuring coherent light, in a direction substantially perpendicular to the long axis that extends from the vertex between two long sides of three sides of the elongated triangle to the shortest side of the three sides of the elongated triangle, perpendicularly to the shortest side of the elongated triangle. In this case, preferably the vertex between the two long sides of the elongated triangular patterns and a center of the shortest side of the elongated triangular patterns are located at the same pitch, respectively. For example, the elongated triangular patterns are preferably so arranged that the long axis that extends from the vertex between two long sides of three sides of each triangle to the shortest side of the three sides of the same triangle, perpendicularly to the shortest side of the same triangle, is in parallel to each other, a half of the elongated triangular patterns are located in a direction opposite to that of the remaining half of the elongated triangular patterns, and the elongated triangular patterns are located separately from one another, at a pitch diffracting a measuring coherent light.

Furthermore, according to the present invention, at least two coma aberration automatic measuring marks, each of which is constituted of a first-order diffraction grating composed of a plurality of elongated triangular patterns located at a pitch diffracting a measuring coherent light, are located in symmetry to each other, and are scanned by the coherent light so that the distance between diffraction lights generated by the two first-order diffraction gratings, is measured and compared with a normal distance between the two first-order diffraction gratings. Thus, only the coma aberration can be automatically measured with a high degree of reproduction.

Furthermore, since the present invention can be applied for measuring the coma aberration and for measuring a telecentric property of an optical axis, the degree of versatility can be elevated.

The invention has thus been shown and described with reference to the specific embodiments. However, it should be noted that the present invention is in no way limited to the details of the illustrated structures but changes and modifications may be made within the scope of the appended claims.

What is claimed is:

1. A coma aberration automatic measuring mark comprising a first-order diffraction grating composed of a plurality of elongated isosceles triangle patterns which are so arranged that the axis of symmetry passing on the center of each elongated isosceles triangle is parallel to one another, wherein a half of said elongated isosceles triangle patterns have a width continually decreasing in a direction opposite to that of the remaining half of said elongated isosceles triangle patterns, and said elongated isosceles triangle patterns are located separately from one another, in a direction perpendicular to said axis of symmetry passing on the center of each elongated isosceles triangle, and at a pitch diffracting a measuring coherent light.

2. The coma aberration automatic measuring mark claimed in claim 1 wherein said pitch diffracting said measuring coherent light is about a double of a lens design wavelength.

3. The coma aberration automatic measuring mark claimed in claim 1 wherein said elongated isosceles triangle patterns include a first group of elongated isosceles triangle patterns and a second group of elongated isosceles triangle patterns, which are located in symmetry to each other, in connection with a line which is positioned between said first group of elongated isosceles triangle patterns and said second group of elongated isosceles triangle patterns and which is perpendicular to said axis of symmetry passing on the center of the elongated isosceles triangle.

4. A coma aberration automatic measuring mark claimed in claim 1 wherein the coma aberration automatic measuring mark measures at least one of a coma aberration and a telecentric property of an optical axis of a lens system.

5. A method for measuring a coma aberration by using a coma aberration automatic measuring mark, comprising at least two first-order diffraction gratings each composed of a plurality of elongated isosceles triangle patterns which are so arranged that the axis of symmetry passing on the center of each elongated isosceles triangle is parallel to one another, that a half of said elongated isosceles triangle patterns having a width thereof continually decreasing in a direction opposite to that of the remaining half of said elongated isosceles triangle patterns, and said elongated isosceles triangle patterns are located separately from one another, in a direction perpendicular to said axis of symmetry passing on the center of each elongated isosceles triangle, and at a pitch diffracting a measuring coherent light, said at least two first-order diffraction gratings being located separately from each other in a direction of said axis of symmetry passing on the center of the elongated isosceles triangle, in such a manner that said elongated isosceles triangle patterns included in said at least two first-order diffraction gratings are in symmetry to each other, in connection with a line which is positioned between said at least two first-order diffraction gratings and which is perpendicular to said axis of symmetry passing on the center of the elongated isosceles triangle, and wherein the method includes the steps of scanning said at least two first-order diffraction gratings by said measuring coherent light, measuring a relative distance between diffraction lights generated by said at least two first-order diffraction gratings, and comparing the measured relative distance with a distance between said at least two first-order diffraction gratings.

6. The method claimed in claim 5 wherein a distance between said at least two first-order diffraction gratings located in symmetry to each other is set to a distance which is sufficiently longer than a wavelength of a measuring coherent light and which is on the order which can make negligible an Abbe error occurring in a coordinate measuring system and a distortion occurring in a reduction projection lens.

7. The method claimed in claim 5 wherein the method is used for measuring a telecentric property of an optical axis, in place of measuring coma aberration.

8. The method claimed in claim 5 wherein said first-order diffraction grating is composed of a plurality of elongated triangular patterns which can be so located that a half of said elongated triangular patterns are located in a direction opposite to that of the remaining half of said elongated triangular patterns, and said elongated triangular patterns are located in parallel to each other and separately from one another, at the pitch diffracting the measuring coherent light, in a direction substantially perpendicular to the long axis that extends from the vertex between two long sides of three sides of the elongated triangle to the shortest side of the three sides of the elongated triangle, perpendicularly to the shortest side of the elongated triangle.

9. A coma aberration automatic measuring mark comprising a first-order diffraction grating composed of a plurality of elongated triangular patterns which are so located that a half of said elongated triangular patterns have a width thereof continually decreasing in a direction opposite to that of the remaining half of said elongated triangular patterns, and said elongated triangular patterns are located in parallel to each other and separately from one another, at the pitch diffracting the measuring coherent light, in a direction substantially perpendicular to the long axis that extends from the vertex between two long sides of three sides of the elongated triangle to the shortest side of the three sides of the elongated triangle, perpendicularly to the shortest side of the elongated triangle.

10. The coma aberration automatic measuring mark claimed in claim 9 wherein said pitch diffracting said measuring coherent light is about a double of a lens design wavelength.

11. The coma aberration automatic measuring mark claimed in claim 9 wherein said elongated triangular patterns includes a first group of elongated triangular patterns and a second group of elongated triangular patterns, which are located in symmetry to each other, in connection with a line which is positioned between said first group of elongated triangular patterns and said second group of elongated triangular patterns and which is perpendicular to said axis of symmetry passing on the center of the elongated isosceles triangle.

12. The coma aberration automatic measuring mark claimed in claim 9 wherein the coma aberration automatic measuring mark is adapted for a measurement of a coma aberration and a measurement of a telecentric property of an optical axis.

* * * * *